United States Patent [19]

Müller

[11] 4,339,875

[45] Jul. 20, 1982

[54] METHOD OF ASSEMBLING A GALVANOMAGNETIC SENSOR IN A CAVITY IN A CONDUCTING PLATE

[75] Inventor: Rolf Müller, St. Georgen, Fed. Rep. of Germany

[73] Assignee: Papst-Motoren KG, St. Georgen, Fed. Rep. of Germany

[21] Appl. No.: 143,604

[22] Filed: Apr. 25, 1980

[30] Foreign Application Priority Data

May 7, 1979 [DE] Fed. Rep. of Germany ....... 2918329

[51] Int. Cl.³ ............................................. H01F 41/02
[52] U.S. Cl. .................................... 29/602 R; 29/596; 29/832; 310/68 R; 318/254
[58] Field of Search ...................... 29/596, 598, 602 R, 29/832; 318/254 A, 138; 310/68 R, 68 E, 68 D, 71

[56] References Cited

U.S. PATENT DOCUMENTS 4,099,104 7/1978 Muller ............................ 318/254 A Primary Examiner—Carl E. Hall
Attorney, Agent, or Firm—Frishauf, Holtz, Goodman & Woodward

[57] ABSTRACT

A Hall generator flexibly held in an aperture of a circuit plate by its contact strips is pressed between a perpendicular elongated flux concentrator with a tapered nose and the center strip of a somewhat resilient flat flux concentrator. A mounting sleeve provides for force-fitting the elongated flux concentrator and for mounting the two flux concentrators in fixed position on the circuit plate on opposite sides thereof. After the elongated flux concentrator is pressed into a position for flushly clamping the Hall generator under the spring effect of at least the flat flux concentrator, the elongated flux concentrator is permanently set with a little adhesive around its upper periphery to insure continuance of the clamping force. The two flux concentrators come quite close to appropriate portions of an external rotor of a brushless d.c. motor.

7 Claims, 12 Drawing Figures

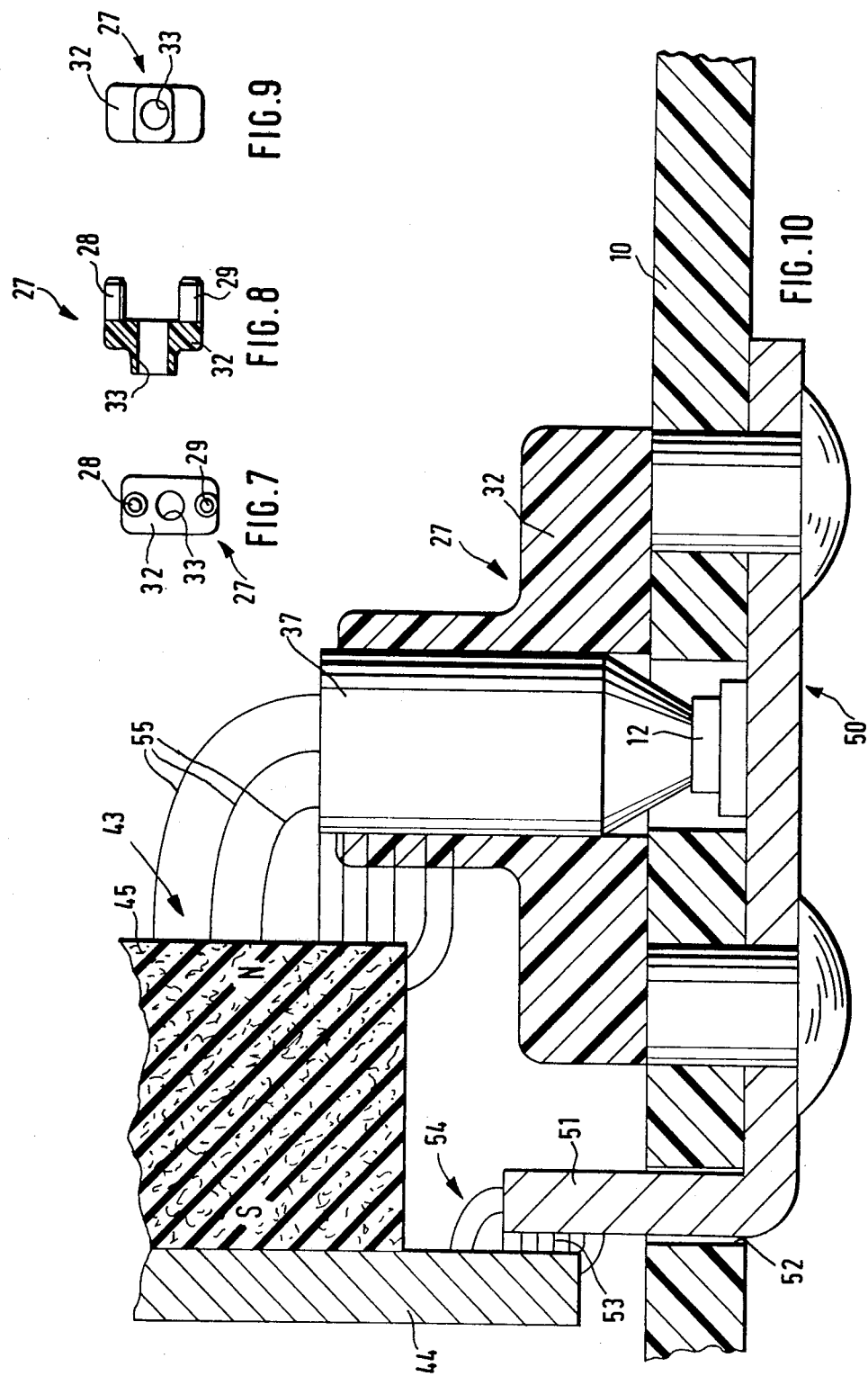

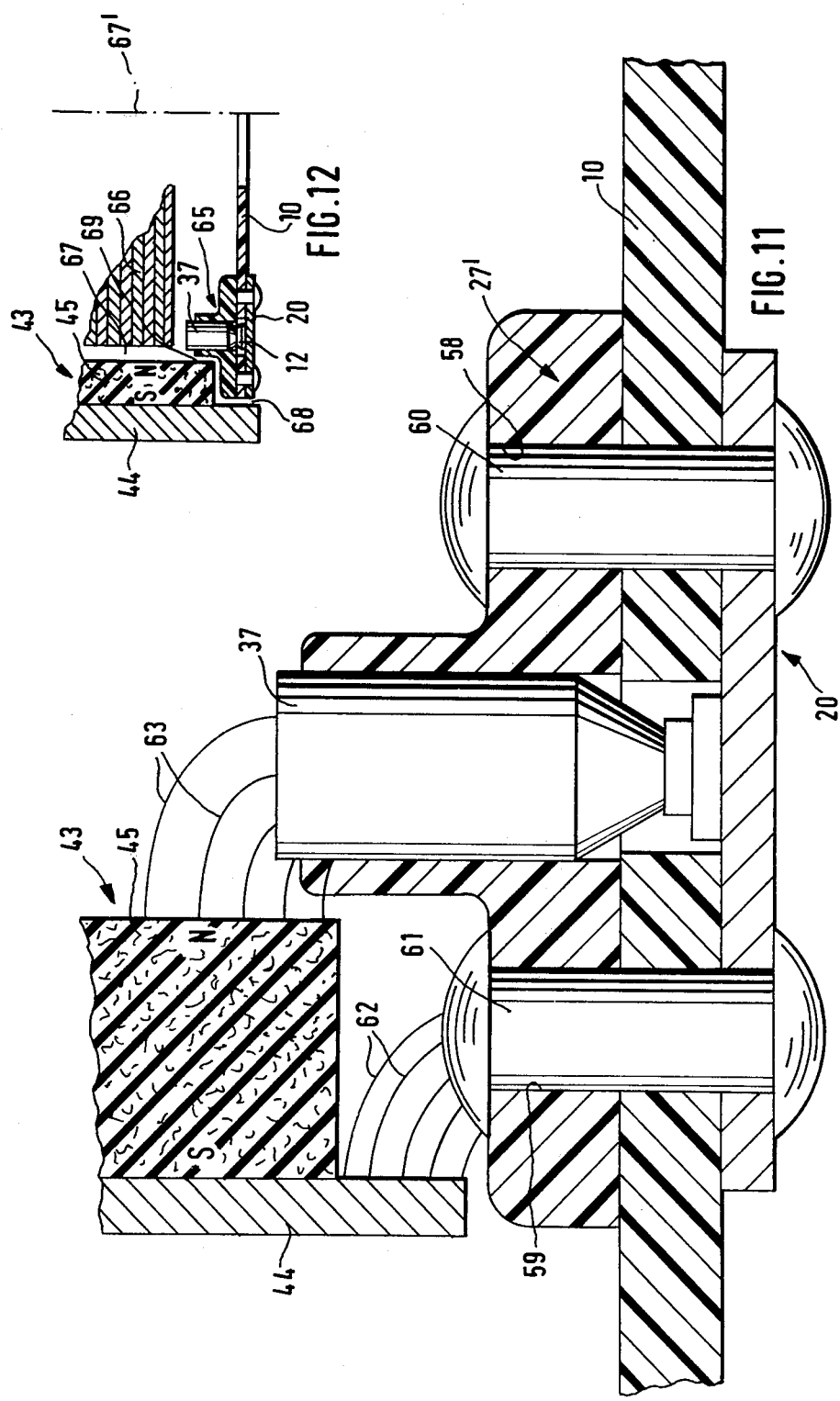

METHOD OF ASSEMBLING A GALVANOMAGNETIC SENSOR IN A CAVITY IN A CONDUCTING PLATE

Reference to related patents and applications: U.S. Pat. No. 4,099,104, Müller; U.S. patent application Ser. No. 060,879, Müller, filed July 26, 1979.

This invention concerns the method of assembling a galvanomagnetic sensor and associated flux concentrating bodies on a printed circuit board, and more particularly a sensor of the Hall generator type on a circuit plate as part of an electric motor, especially a brushless d.c. electric motor having an external rotor carrying an annular magnet mounted on the bell-shaped or cup-shaped rotor structure.

Swiss Pat. No. 504,132 discloses a motor of the kind last mentioned in which a sensor is mounted on a circuit plate and describes mounting of the assembly that includes the sensor.

The structure there shown and the method disclosed for assembling it has the disadvantage that it is difficult to fit the sensor between its flux concentrators in a manner which is clearly free of unnecessary and disadvantageous air gaps. In many cases, the magnetic flux that is available for enabling the sensor to perform its function is not great. This is particularly the case when the sensor operates on stray flux, as is the case in the motor described in the above-mentioned Swiss patent.

Furthermore, in many motors of the type just referred to there are nowadays used the so-called "rubber magnets" which are magnets made of an elastomer material in which ferrite particles are embedded. These rubber magnets are easy to shape, modify or treat, but they produce only low densities of usable magnetic flux, so that the stray flux density in the case of these magnets is particularly low. It then, for example, an undesired air gap of only 0.1 mm is produced at the location of the galvanomagnetic sensor, that can already mean that the available electric output signal is reduced by 50 percent, and an undesired air gap of 0.2 mm means a reject rather than a usable product.

Since Hall generators are very expensive, such a result is highly undesirable for cost reasons alone.

On account of the tight space requirements, it is necessary in many cases to use relatively large flux concentrating bodies as, for example, a complete ring in the case of the Swiss patent already mentioned. Normally, such a sensor can be assembled with its flux concentrators, which is to say in its own magnetic circuit, only when it is on the circuit plate to which it is connected electrically. This invention applies particularly in such arrangements which the magnetic circuit of the galvanomagnetic sensor is of relatively complicated construction. Hall generators with so-called catch plates ("Fangblechen") for flux concentration are known from the publication known as *ETZ-A*, Volume 81 (1960), pp. 323–327.

The method of assembling and affixing the Hall generator to a plate there described is hardly satisfactory for the reason, among others, that wedge-shaped air gaps can easily arise adjacent to the Hall generator in this construction.

SUMMARY OF THE INVENTION

It is an object of the present invention to provide a suitable method and means for assembling a sensor with its flux concentrators on its supporting plate so as to produce a good output signal for the sensor and, at the same time, simplify the assembly.

Briefly, a way has been found to mount the sensor so that it is clamped in a gapless fashion between its flux concentrating bodies so that the signal produced is not diminished by the presence of any unwanted air gaps. The galvanomagnetic sensor, which is typically a Hall generator mounted on a ferrite piece, is subject to a bias force that is at least approximately perpendicular to the plane of the circuit plate in which the sensor is seated (in a cavity in the plate). This feature is of great importance for avoiding uneven and particularly wedge-shaped air gaps resulting from uneven clamping of the sensor caused by clamping forces that are themselves unsymmetrical. In consequence with minimum assembly expense, the sensor arrangement providing a good output signal can be obtained and the number of rejects resulting from insufficiently careful assembly is drastically reduced. A flat flux concentrator of spectrocal shape is mounted below the conducting plate so that the sensor can be pressed against the bridge-strip portion thereof by the flat-nosed surface of a tapered portion of a substantially cylindrical upper flux concentrator that presses the sensor downward. A mounting piece having a cylindrical passage for the upper flux concentrator is riveted through the circuit plate and through the eyes of the lower flux concentrator, thus holding the assembly together. The passage for the upper flux concentrator is of slightly smaller diameter than the diameter of the flux concentrator body, so that a force fit can be obtained and a downward force maintained against the sensor and ultimately against the slightly yielding lower flux concentrator and the upper flux concentrator can be sealed in position.

Further advantages of the invention will be made clear in the detailed description that follows:

BRIEF DESCRIPTION OF THE DRAWINGS

The invention is further described by way of illustrative examples with reference to the annexed drawings, in which:

FIGS. 7–9 are bottom, side (partly in section), and top views, respectively, of a preferred shape of the mounting sleeve of FIGS. 4–6, on a magnified scale of 2:1;

FIG. 10 is a first modified form of sensor and flux concentrator assembly for providing a desirable magnetic circuit for the sensor assembly, shown mostly in section;

FIG. 11 is a second modification, also shown mostly in section, of the sensor assembly for providing a suitable magnetic circuit for the sensor assembly; and FIG. 12 is a diagram, mostly in section, showing a preferred disposition of the sensor and its assembly in a brushless d.c. motor of the external rotor type.

DESCRIPTION OF THE PREFERRED EMBODIMENTS

Figure 1:
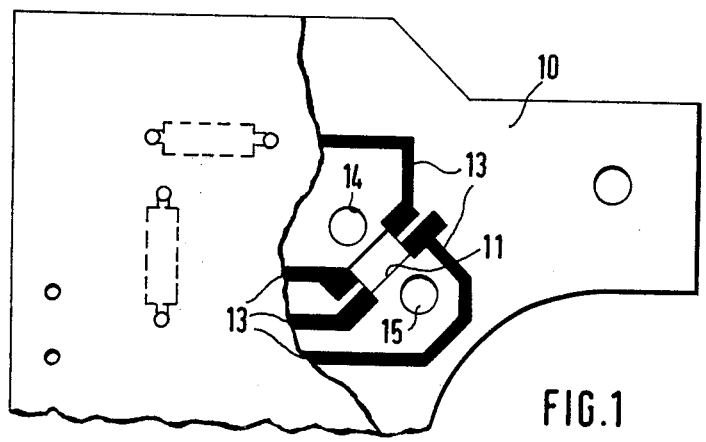
FIG. 1 is a plan view, seen from below, with part of the printed circuit layer removed, constituting a part for a brushless d.c. motor and having a place for mounting a Hall generator, being drawn on a magnified scale (about 2:1)

The circuit plate 10 shown in FIG. 1 is made of a suitable insulating material, for example, a glass fiber laminate. It has a rectangular aperture 11 for receiving the galvanomagnetic sensor 12 (see FIG. 2), which, in this case, is in the form of a Hall generator. Other forms of sensors which could be used are a magnetic diode, a field plate, etc. The conducting plate 10 has four conducting paths 13 of copper or gold. Near each of the two long sides of the rectangular aperture 11 are respectively located the round holes 14 and 15.

Figure 2:
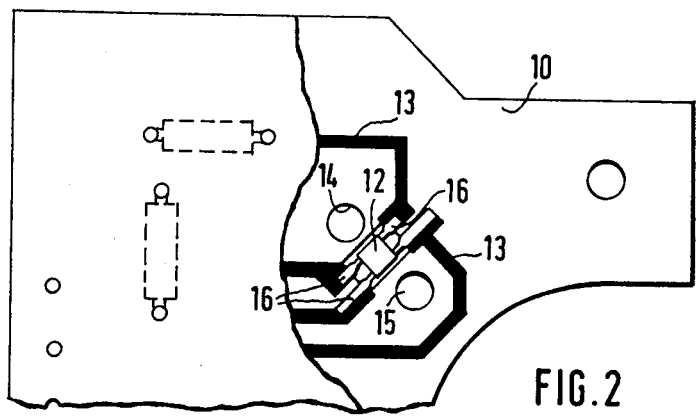
FIG. 2 is a plan view of the circuit plate of FIG. 1 after the soldering in of a Hall generator.
Figure 3:
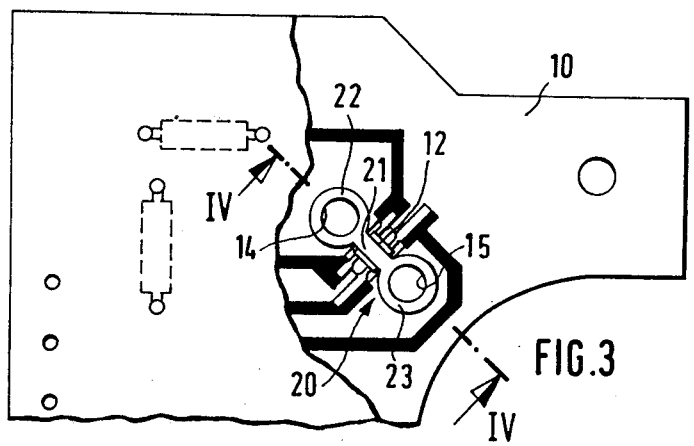
FIG. 3 is a plan view of the circuit plate of FIG. 2 after the lower, and preferably flat, flux concentrator has been put in place.

The Hall generator 12, as shown in FIG. 2, has four connection tabs 16 (two for supplying the Hall current and two for picking up the output voltages that depend upon the magnetic field). As shown in FIGS. 2 and 3, the connection tabs 16 are soldered to the circuit path 13 so that the Hall generator itself does not receive any of the solder and, preferably, so that the Hall generator projects slightly above the surface of the conducting plate on the side from which the views of FIGS. 1, 2 and 3 are seen. This slight sticking out of the Hall generator results in practice by the spring-flexing of the connection tabs of the Hall generator.

As shown, the four connecting paths 16 of the Hall generator extend past only two opposite sides or edges of the Hall generator which has the shape of a square wafer, so that the other two side edges of the wafer are clear of electrical connections. Extending across the last-mentioned side edges, a first flux concentrator 20 is placed as shown in FIG. 3 which has an aspect similar to the front part of an eyeglasses (spectacle) frame. It has a narrow central portion (or bridge) 21, connecting to open circles forming the eyes 22 and 23, the apertures of which are flush with the round holes 14 and 15 in the circuit plate 10, as is clear from FIG. 3. The middle strip or bridge 21 lies against the Hall generator 12 and presses it somewhat into the aperture 11, so that the Hall generator 12 lies flat against the strip 21 under spring pressure.

Of course, the Hall generator could lie more deeply in the aperture 11, in which case the flux concentrator 12 would have a step toward the interior of the aperture 11 so that, again, it could lie close and flush against the Hall generator 12 (under pressure from the other side of the Hall generator as will presently be explained).

Figure 4:
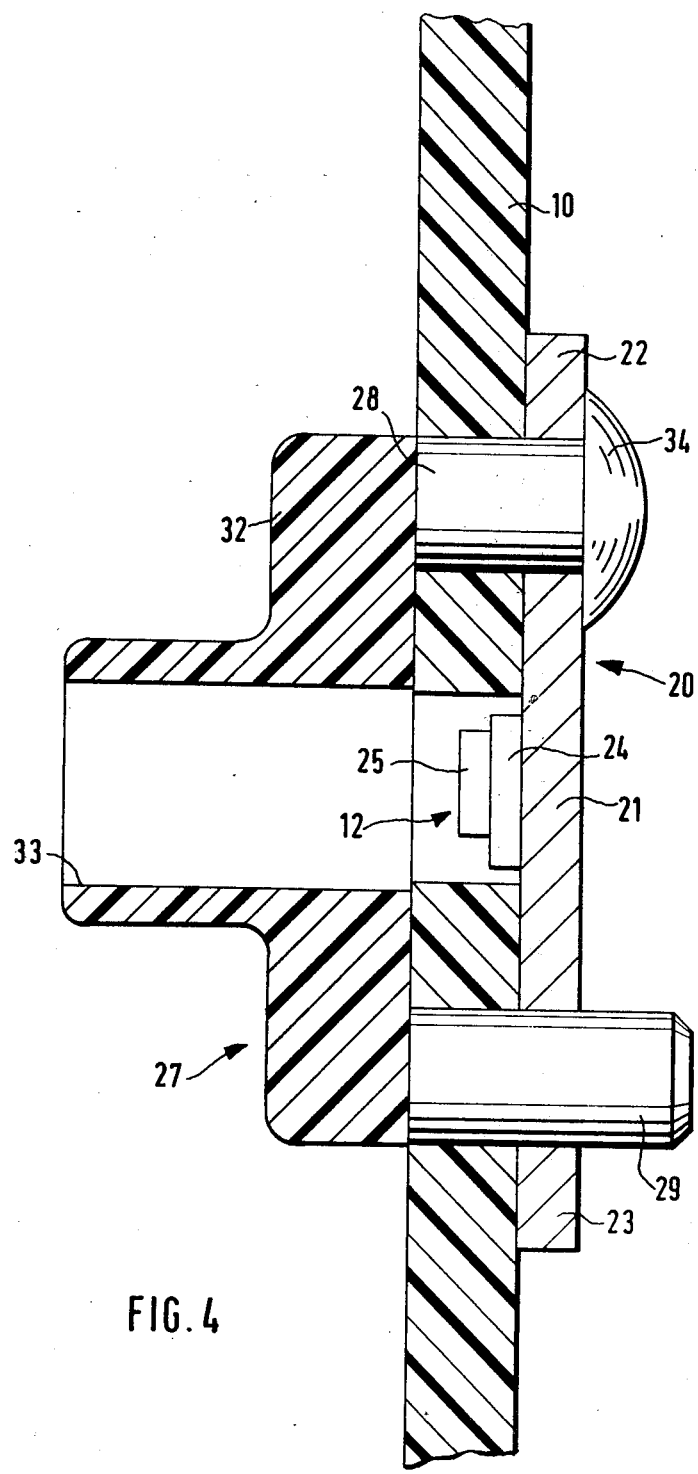
FIG. 4 is a section along the lines IV—IV of FIG. 3 through the all generator, conducting plate, lower of first flux concentrator and a flange-mounting sleeve for affixing the flux concentrators on the two sides of the circuit plate, on a greatly magnified scale (about 12:1)

The first flux concentrator 12 can, for example, have a thickness of 0.75 mm, the thickness of a typical thin sheet metal, and an overall length of 13 mm. The middle strip or "bridge" may typically have a width of 1.5 mm. The Hall generator 12 is preferably one mounted on a ferrite base 24 (FIG. 4) having, also, a small built-in ferrite flux concentrator on its upper side. The ferrite base and the flux concentrator 25 should preferably have a metallic surface in order to make possible direct contact without any interfering air gap. FIG. 4 shows how the ferrite base of the Hall generator 12 lies directly on the middle strip 21 of the first flux concentrator 20.

As shown in FIG. 4, a mounting element 27, the exact form of which is apparent from FIGS. 7–9 and may generally be described as a sleeve with appendages, is now mounted on the conducting plate. The sleeve 27 consists of a non-magnetic material, which could be brass, but is preferably a thermoplastic resin, for example, the material commercially sold with the trademark "MACROLON." The sleeve has two cylindrical extensions 28 and 29 for insertion through the holes 14 and 15 of the circuit plate 10 and through the eyes 22 and 23 of the first flux concentrator 20.

These extensions 28 and 29 are fixed extensions of a main body portion 32 that has a passage 33 down its middle which is typically circularly cylindrical in shape and in mounted position is coaxial with the galvanomagnetic sensor 12, as clearly appears in FIG. 4.

Figure 5:
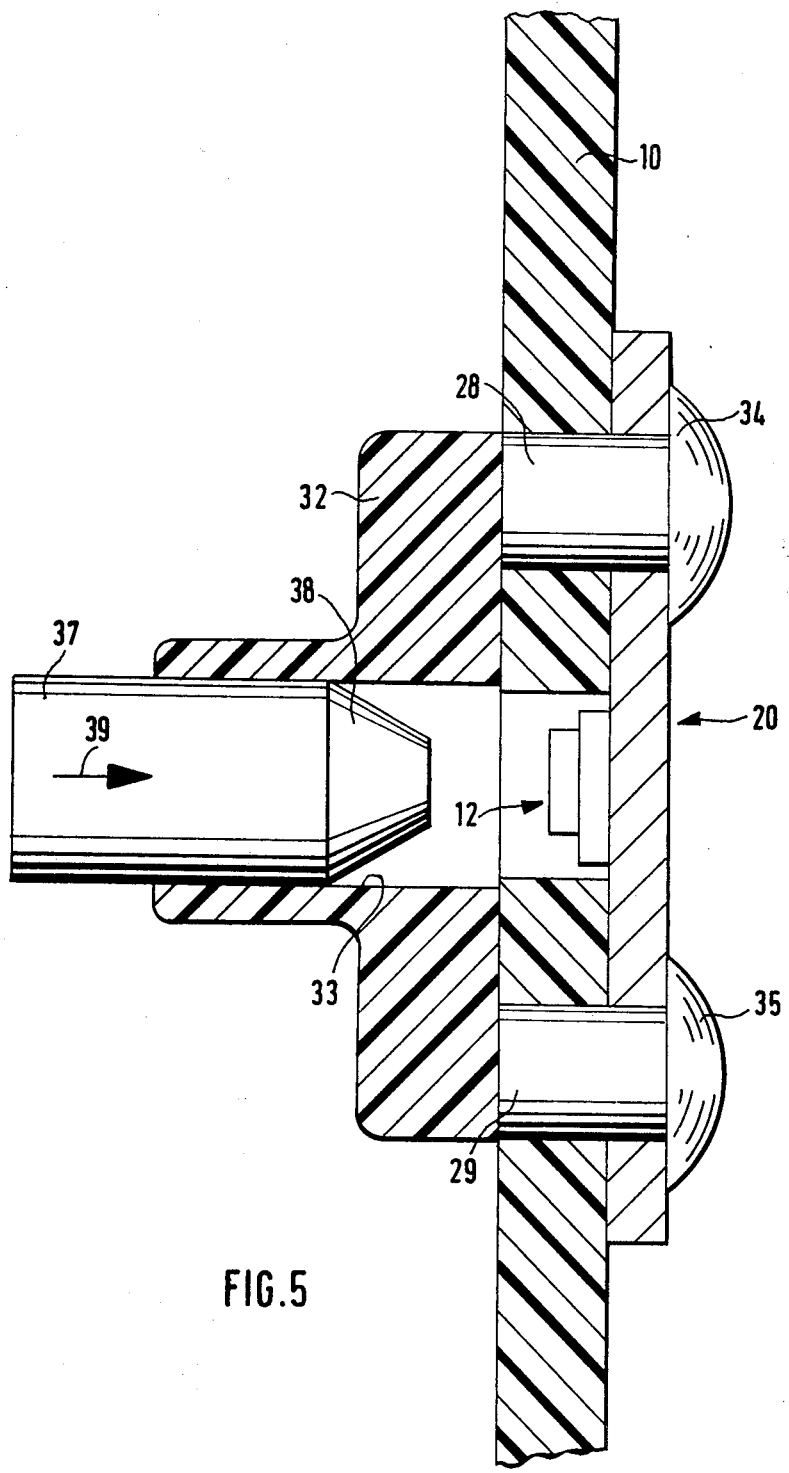
FIG. 5 is a section analogous to FIG. 4 showing the insertion of the upper or second flux concentrator.

As FIG. 4 also shows, the extensions 28 and 29 are riveted in place by heat deformation of their ends. FIG. 4 shows the rivet head 34 of the extension 28, but shows the extension 29 as it appears before riveting. In FIG. 5, the extension 29 is also provided with a rivet head 35. In this manner the first flux concentrator 20 is immovably fixed on the circuit plate 10 in its position lying against the Hall generator 12 and, at the same time, the sleeve 32 is fastened in the desired position on the circuit plate 10.

The next step of assembly is to mount a second flux concentrator 37 as shown in FIG. 5. This member has a cylindrical shape over the larger portion of its length, with a diameter, for example, of 3.1 mm, the total length of the flux concentrator 37 being, for example, 6 mm, including the taper of its end facing the Hall generator 12 which has frustoconical shape tapering down to about ⅓ of the diameter of the cylindrical portion, thus to 1 mm so that its cross-sectional area at this end is reduced to about 1/9 of the cross-sectional area of the cylindrical portion, correspondingly increasing the magnetic flux there, approximately nine-fold.

Figure 6:
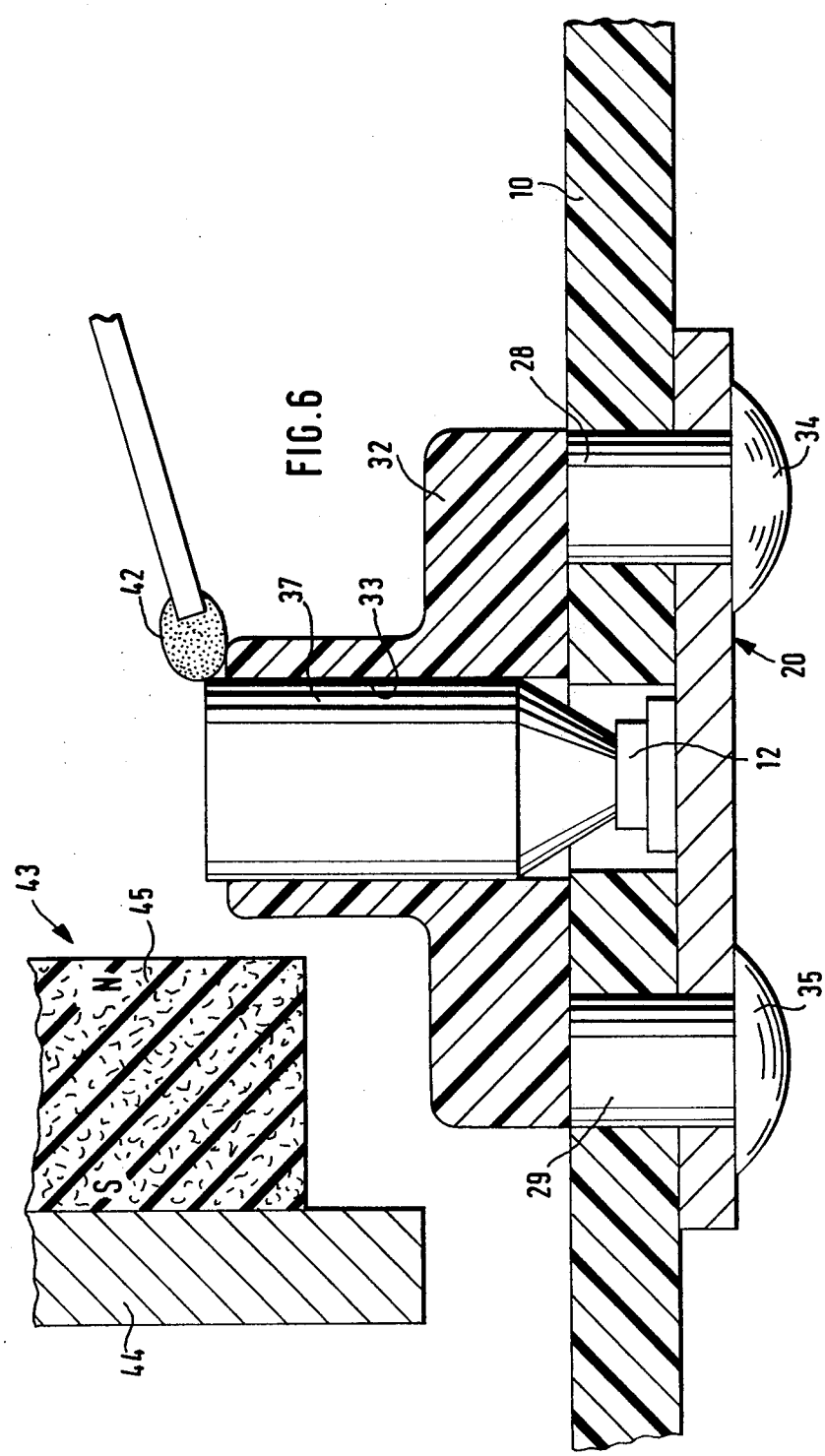
FIG. 6 is a section analogous to FIGS. 4 and 5 showing the adhesive sealing place in place of the second flux concentrator and also the relation of the circuit plate and sensor assembly to the annular rotor magnet of a brushless d.c. motor.

The inner diameter of the passage 33 is somewhat smaller than that of the cylindrical portion of the flux concentrator 37, for example, only 3.05 mm, so that the flux concentrator 37 is insertable only by a force 39 (FIG. 5) and can be pushed down to flush contact against the Hall generator 12, pressing the latter against the first flux concentrator 20, so that the Hall generator 12 is clamped in between the two flux concentrators 20 and 37 without interfering air gaps as shown in FIG. 6.

The relatively thin flux concentrator 20 is thus normally somewhat deformed elastically, so that it operates as a spring which presses the Hall generator 12 against the second flux concentrator 37. The flux concentrator 37 is permanently fixed in this position by a drop 42 of a single-component adhesive, as shown in FIG. 6. The mounting of the assembly is thereby completed.

FIG. 6 also shows a preferred relative position of the assembly just described on the circuit plate 10 and the external rotor 43 of a brushless d.c. motor. (The axis of rotation would lodge somewhere to the right in the FIG. 6 drawing.

The rotor 43 comprises a rotor bell 44 and a radially polarized permanent magnet 45 that extends from the cup or bell 44 to a position quite close to the second flux concentrator 37. In the illustrated preferred configuration, the stray or spreading field from the north pole N of the magnet 45 proceeds to the flux concentrator 37 and the stray or spreading field from the south pole S proceeds through the ferromagnetic rotor bell 44 and then through the first flux concentrator 20, so that all together there is produced a sufficiently great magnetic flux density at the Hall generator 12, resulting in the generation of a sufficiently large signal.

If needed, the first and/or second flux concentrator can, of course, be made larger in order to obtain still stronger signals. This depends upon the particular application and particularly from the amount of amplification available in the control circuit.

It is also evident that instead of by thermal riveting of the flux concentrator 20 and the sleeve 32 onto the plane 10, other kinds of fastening can be used. The illustrated type of fastening is preferred, however.

FIG. 10 shows a first modification of the configuration of FIG. 6 that is particularly well suited for an external rotor type of brushless d.c. motor and provides a relatively high output signal for the sensor arrangement according to the present invention. Parts which are the same or operate in the same way, as in the previous figures, are designated in FIG. 10 with the same reference numerals and are accordingly not again described here. The same applies for the variants shown in FIGS. 11 and 12.

The first flux concentrator 50 in FIG. 10 is provided at its left or radially outward end with a section 51 bent up at right angles, which passes through a perforation 52 in the circuit plate 10 and projects upward out of it. The end section 51 has a rectangular cross-section which is not shown in the drawing, which may for example have the dimensions of 0.75×4 mm and, for example, may have the length of 5 mm or whatever is appropriate to enable it to overlap the inner surface of the rotor bell 44 with the formation of a radial air gap 53 for a part of its length, as shown in FIG. 10. The second flux concentrator 37 lies, as shown, rather close to the rotor magnet 45. FIG. 10 schematically shows at 54 the magnetic lines of force in the air gap 53 and at 55, the magnetic lines of force that extend from the rotor magnet 45 to the second flux concentrator 37. In all other respects, the manner of operation is the same as in the case of FIG. 6. Here also, the Hall generator 12 is symmetrically clamped so that it is held aflush against the two flux concentrators 37 and 50, and no wedge shaped air gaps can arise.

FIG. 11 shows a second modification that is likewise very well suited for a motor with an external rotor, only a small part of the rotor and the complete sensor assembly again being shown.

The sleeve 27' is in this case provided with a somewhat wider base than in the other examples, so as to make room for two bores 58 and 59 for respectively seating the rivets 60 and 61, of which the lefthand rivet 61 is made of magnetically soft wheel, while the righthand rivet 60 may for example be of brass. Alternatively, the righthand rivet 60 and its mounting hole in the member 27' could be replaced by a cylindrical downward extension, such as is shown in the first embodiment.

The lefthand rivet 61 of FIG. 11 serves here as a flux guiding piece, and the magnetic lines of force 62 are accordingly shown going from it to the rotor bell 44, while the magnetic lines of force from the rotor magnet 43 to the second flux concentrator 37 are indicated at 63. The rotor bell 44 is here shown extending down to the vicinity of the upper head of the rivet 61, while the rotor magnet 45 is so arranged that its lower inward edge overlaps slightly the flux concentrator 37 and its holding sleeve, leaving a small air gap.

FIG. 12 shows (on an enlarged scale of about 2:1) a variant mounting for a sensor assembly 65 which corresponds in its construction basically to the first illustrated embodiment (FIG. 6). In FIG. 12, a part of the stator 66 of a brushless d.c. motor is shown, as well as a portion of external rotor 43, and the axis of rotation of the latter is indicated at 67. A small radial operating air gap 68 appears between the stator 66 and the magnet 45 of the rotor 43.

The conductor plate 10 is in this case in the shape of a flat annulus and has a diameter that is smaller than the inner diameter of the rotor bell 44, so that it can lie inside the lower extremity of the rotor bell 44, leaving only a relatively small air gap 68a between the latter and the first flux concentrator 20. The lower inner edge of the rotor magnet 45, which here also is preferably a so-called rubber magnet (mixture of hard ferrite powder and rubber), lies close to the second flux concentrator 37, so that there also only a small air gap 69 is present. The magnetic flux then goes from the inner side of the rotor magnet 45, across the air gap 69 to the second flux concentrator 37, thence through the Hall generator 12 to the first flux concentrator 20 and from there across the air gap 68a and through the rotor bell 44 back to the magnet 45. In consequence, there results a relatively powerful signal at the output of the Hall generator 12, because the magnetic flux concentration in the Hall generator 12 is very large.

It is important in all the illustrative examples that the Hall generator 12 is symmetrically clamped, i.e. that the same clamping forces are exerted on both sides, in contrast to arrangements in which a flux concentrator lies against a Hall generator only on one side and thereby feeds the possibility that a wedge-shaped air gap can form. If, for example, in FIG. 11 one of the two rivets 60 or 61 were left out, this risk would arise. The clamping provided symmetrically on two sides, or on more than two sides, thus provides a distinctive feature of the invention in its preferred form in order to obtain a clamping force that operates as perpendicularly as possible on the Hall generator 12.

A sensor assembly and mounting according to the present invention is suitable for all control purposes, for example also for control of shelf storage lifts, applications in motor vehicle equipment, burglar alarms, etc. It is also evidently possible to equip the second and/or the first flux concentrator with an extension for preferentially catching or diverting spreading fields from one of the stator poles according to the teaching of German Pat. No. 2,612,464, to which reference is made for further details of such an arrangement.

It should be further mentioned that the part 37 can also be made as a stamping and does not need to have a cylindrical cross-section, although the cylindrical form is currently the preferred form.

It should also be mentioned that the invention is also suitable for use in a motor of the kind illustrated in the copending application of the present applicant owned by the assignee of the present application, Ser. No. 060,879, filed July 26, 1979.

It will accordingly be understood that although the invention has been described with reference to particular illustrative embodiments, with mention of certain other possible variations, many modifications and variations are possible within the inventive concept.

I claim:

1. A manufacturing method for assembling and mounting a galvanomagnetic sensor, such as a hall generator, in a cavity in a circuit board, means being provided for flux concentration including on one side of the circuit board a flat flux concentrator and on the other side of said circuit plate, a flux concentrating body that is tapered toward said galvanomagnetic sensor, said method comprising the steps of:

(a) mounting said galvanomagnetic sensor in said cavity in said circuit board;
   (b) thereafter affixing a first flux concentrating means of generally flat configuration on the one side of said sensor;
   (c) bringing said flux concentrating body which is tapered toward said sensor, into position immediately adjacent that sensor by force fitting into a holder; and
   (d) fixing said tapered flux concentrator in its position adjacent to said galvanomagnetic sensor, relative to said circuit board.

2. A method as defined in claim 1 in which in the first step (a) specified in claim 1 said galvanomagnetic sensor is connected with conducting paths of said circuit board by soldering or the like.

3. A method as defined in claim 1 in which in the third step (c) of said method, the force of said force fitting is applied at least approximately perpendicular to the plane of said circuit board on which said sensor is mounted in said cavity.

4. A method as defined in claim 3 in which in the third step (c) of said method, said holder is attached to said other side of said circuit board, said holder having a passage for shiftably accepting said tapered flux concentrating body, in which passage said tapered flux concentrating body is pushed in until it meets said galvanomagnetic sensor.

5. A method as defined in claim 4 in which in the fourth step (d) of said method, said tapered flux concentrating body is permanently fastened in said passage of said holder.

6. A method as defined in claim 5 in which in the second step (b) thereof said flat flux concentrating means is permanently fastened to said holder for said tapered flux concentrating body as well to said circuit plate.

7. A method as defined in claim 6 in which said flat flux concentrating means is fastened to said holder in a disposition substantially symmetrical with reference to said galvanomagnetic sensor.

* * * * *

UNITED STATES PATENT AND TRADEMARK OFFICE
CERTIFICATE OF CORRECTION

PATENT NO. : 4,339,875
DATED : July 20, 1982
INVENTOR(S) : Rolf MÜLLER

It is certified that error appears in the above—identified patent and that said Letters Patent is hereby corrected as shown below:

In Col. 3, line 14, change "circuit plate" to --circuit board--;
line 20, change "conducting plate" to --circuit board--.

In Col. 4, line 6, change "conducting plate" to --circuit board--;
line 25, change "circuit plate" to --circuit board--;
line 27, change "circuit plate" to --circuit board--;
line 58, change "circuit plate" to --circuit board--.

In Col. 5, line 28, change "circuit plate" to --circuit board--.

In Col. 6, line 12, change "conductor plate" to --circuit board--.

In Col. 7, line 6 (claim 1), change "circuit plate" to --circuit board--.

In Col. 8, line 21 (claim 6), change "circuit plate" to --circuit board--.

Signed and Sealed this

Fourth Day of January 1983

[SEAL]

Attest:

GERALD J. MOSSINGHOFF

Attesting Officer   Commissioner of Patents and Trademarks